United States Patent
Allen et al.

(10) Patent No.: US 7,242,237 B2
(45) Date of Patent: Jul. 10, 2007

(54) SUPPLY SWITCH CIRCUIT FOR IMPLEMENTING A SWITCHABLE ON-CHIP HIGH VOLTAGE SUPPLY

(75) Inventors: David Howard Allen, Rochester, MN (US); Lew Chua-Eoan, San Diego, CA (US); Mathew I. Ringler, Burlington, VT (US)

(73) Assignee: International Business Machines Corporation, Armonk, NY (US)

( * ) Notice: Subject to any disclaimer, the term of this patent is extended or adjusted under 35 U.S.C. 154(b) by 488 days.

(21) Appl. No.: 10/877,239

(22) Filed: Jun. 25, 2004

(65) Prior Publication Data

US 2005/0285578 A1    Dec. 29, 2005

(51) Int. Cl.
*H03K 17/687*    (2006.01)

(52) U.S. Cl. .................. 327/427; 307/130; 327/543

(58) Field of Classification Search ............... 327/427; 307/130
See application file for complete search history.

(56) References Cited

U.S. PATENT DOCUMENTS

| | | | |
|---|---|---|---|
| 5,610,547 A * | 3/1997 | Koyama et al. ............ 327/350 |
| 7,138,968 B2 * | 11/2006 | Kasai et al. .................. 345/76 |
| 2002/0043991 A1 * | 4/2002 | Nishitoba ..................... 327/94 |
| 2004/0104433 A1 * | 6/2004 | Ieong et al. ................. 257/347 |

* cited by examiner

*Primary Examiner*—Kenneth B. Wells
*Assistant Examiner*—Ryan C. Jager
(74) *Attorney, Agent, or Firm*—Joan Pennington

(57) ABSTRACT

A supply switch circuit is provided for implementing a switchable on-chip high voltage supply. A stack of transistors is coupled between an on-chip high voltage supply and a circuit node. A control signal is coupled to the stack of transistors for selectively switching the high voltage supply to the circuit node. The control signal is coupled to a voltage divider included with the stack of transistors to limit a maximum node voltage within the stack of transistors.

18 Claims, 2 Drawing Sheets

SUPPLY SWITCH CIRCUIT FOR IMPLEMENTING A SWITCHABLE ON-CHIP HIGH VOLTAGE SUPPLY

FIELD OF THE INVENTION

The present invention relates generally to the data processing field, and more particularly, relates to a supply switch circuit for implementing a switchable on-chip high voltage supply.

DESCRIPTION OF THE RELATED ART

As technologies evolve, power supply voltages are being reduced and I/O performance requirements are increasing. In addition, I/O circuits are often required to support more than one generation of technologies and this requires the I/O circuits to operate over an increasing range of power supply voltages.

A switchable high voltage supply is required for various on-chip circuits and macros. For example, a switchable high voltage supply is required for an existing fuse macro circuit in order to achieve a proper resistive fuse value. This resistive setting is crucial for proper sensing of fuse state. It is desirable to provide the switchable high voltage supply on-chip with a particular circuit or macro.

An off-chip supply switch is an alternative to an on-chip supply switch. However, the off-chip supply switch requires proper I/O signaling to an external power-switching device. For example, a discrete PNP transistor device would be used to enable or disable power to a supply pin of the particular circuit or macro, such as the fuse macro circuit. The extra systems cost of one or more signal pins and associated timing logic for proper supply enabling and settling is significant.

A need exists for a mechanism for implementing a switchable on-chip high voltage supply. It is desirable to provide such mechanism for implementing a switchable on-chip high voltage supply that has a generally simple configuration and is inexpensive.

SUMMARY OF THE INVENTION

A principal aspect of the present invention is to provide a supply switch circuit for implementing a switchable on-chip high voltage supply. Other important aspects of the present invention are to provide such supply switch circuit substantially without negative effect and that overcome many of the disadvantages of prior art arrangements.

In brief, a supply switch circuit is provided for implementing a switchable on-chip high voltage supply. A stack of transistors is coupled between an on-chip high voltage supply and a circuit node. A control signal is coupled to the stack of transistors for selectively switching the high voltage supply to the circuit node. The control signal is coupled to a voltage divider included with the stack of transistors to limit a maximum node voltage within the stack of transistors.

In accordance with features of the invention, the stack of transistors includes series connected P-channel field effect transistors (PFETs) having the control signal coupled to a respective gate of the PFETs. The voltage divider is defined by a first PFET of the stack of series connected PFETs having a source connected to the high voltage supply, a series connected resistor and an N-channel field effect transistor (NFET) connected between a drain of the first PFET and a ground connection. The control signal is coupled to a gate of the voltage divider NFET.

In one embodiment, the stack of series connected PFETs includes a pair of PFETs, each having a predefined channel length for a set voltage drain to source. The predefined channel length of the pair of PFETs is greater than a channel length of the NFET of the voltage divider.

In another embodiment, the stack of series connected PFETs includes three series connected PFETs. A second voltage divider is defined by a second PFET having a source connected to a drain of the first PFET, a series connected resistor and an N-channel field effect transistor (NFET) connected between a drain of the second PFET and a ground connection.

BRIEF DESCRIPTION OF THE DRAWINGS

The present invention together with the above and other objects and advantages may best be understood from the following detailed description of the preferred embodiments of the invention illustrated in the drawings, wherein.

DETAILED DESCRIPTION OF THE PREFERRED EMBODIMENTS

In accordance with features of the invention, a supply switch provides a switchable on-chip high voltage supply to an associated macro circuit. For example, the supply switch of the invention allows for a high supply voltage or blow voltage and significant current to be delivered to fuse element. That is the high supply voltage or blow voltage is higher than nominal device supply requirements. The supply switch of the invention is implemented on the same die where the associated macro circuit, such as the fuse function, is to be implemented, as opposed to externally, separate from the fuse function die. The supply switch of the invention can be implemented by bulk or silicon-on-insulator (SOI) complementary metal oxide semiconductor (CMOS) technology.

Figure 1:
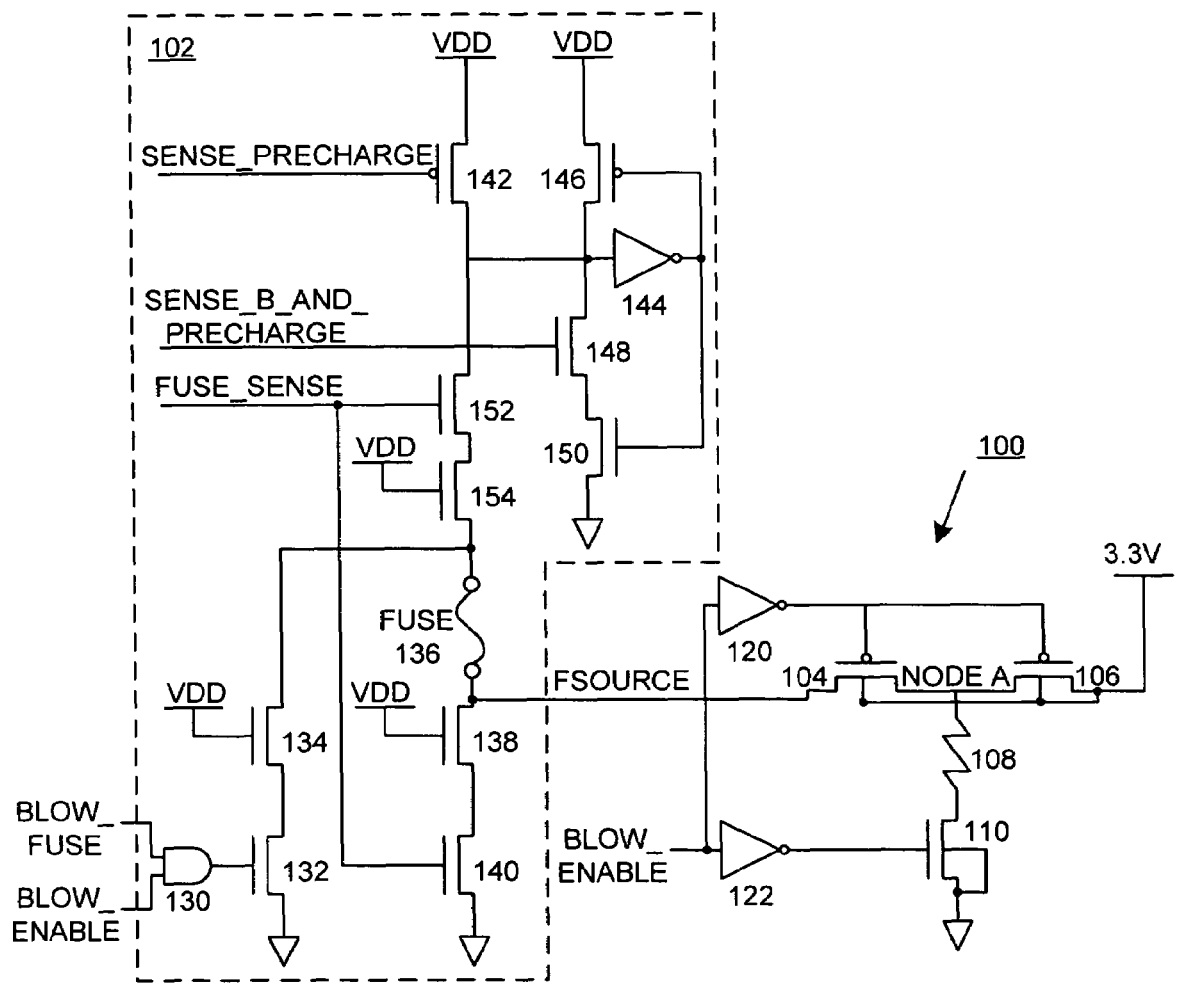
FIG. 1 is schematic diagram illustrating an exemplary supply switch circuit for implementing a switchable on-chip high voltage supply for a fuse macro circuit in accordance with the preferred embodiment.

Having reference now to the drawings, in FIG. 1 there is shown an exemplary supply switch circuit for implementing a switchable on-chip high voltage supply in accordance with the preferred embodiment generally designated by the reference character 100. Supply switch circuit 100 is coupled to a fuse macro circuit shown within dotted line and generally designated by the reference character 102. Supply switch circuit 100 is adapted to provide a selected voltage at node FSOURCE of the fuse macro circuit 102, for example, at 3.3 volts or zero volts responsive to an applied control signal labeled BLOW_ENABLE.

Supply switch circuit 100 includes a stack of transistors 104, 106 coupled between an on-chip high voltage supply, for example, 3.3 volts and a circuit node labeled FSOURCE. Supply switch circuit 100 includes a voltage divider that is included with the stack of transistors 104, 106 to limit a maximum node voltage within the stack of transistors. A control signal BLOW_ENABLE is coupled to the stack of transistors for selectively switching the high voltage supply to the circuit node. The control signal also is coupled to the voltage divider.

As shown, the stack of transistors includes series connected P-channel field effect transistors (PFETs) 104, 106. The voltage divider is defined by the first PFET 106 that has a source connected to the high voltage supply, a series connected resistor 108, and N-channel field effect transistor (NFET) 110 connected between a drain of the first PFET 106 and a ground connection. The control signal BLOW_ENABLE is coupled to a respective gate of the PFETs 104, 106 by an inverter 120. The control signal is coupled to a gate of the voltage divider NFET 110 by an inverter 122.

PFETs 104, 106 and NFET 110 can be implemented by silicon-on-insulator (SOI) FETs or bulk FETs. Resistor 108 preferably is constructed of a high reliability resistor element to mitigate reliability issues, but may be constructed if needed via diode connected thick metal oxide semiconductor (MOS) gates.

Stacked PFETs 104, 106 are, for example, thick oxide devices acting as a switch to enable the 3.3V supply voltage and appropriate current to the fuse macro circuit 102 at node FSOURCE. When the control signal BLOW_ENABLE is low, the FSOURCE node is tristated (barring large leakage currents).

As shown, fuse macro circuit 102 includes an AND gate 130 receiving a BLOW_FUSE signal and the control signal BLOW_ENABLE. The output of AND gate 130 is applied to a gate of an NFET 132. NFET is connected in series with an NFET 134 having a gate tied to a voltage supply rail VDD, for example, at +1 V. The series connected NFETs 132, 134 are connected between a fuse 136 and ground connection. A pair of series connected NFETs 138, 140 are connected between the other side of the fuse 136 at node FSOURCE and ground. A SENSE_PRECHARGE gate is applied to a PFET 142. A source of PFET 142 is connected to voltage supply rail VDD and a drain of PFET 142 is connected to an inverter 144 and a drain of a PFET 146. A pair of series connected NFETs 148 and 150 is connected between the drain of PFET 146 and ground. A pair of series connected NFETs 152 and 154 is connected between the drain of PFET 142 and the fuse 136. A FUSE_SENSE input is applied to a gate of NFET 152 and a gate of NFET 140. Inverter 144 provides a gate to PFET 150 and to PFET 146 that has a source connected to voltage supply rail VDD. A SENSE_B_AND_PRECHARGE input is applied to a gate of NFET 148.

The fuse 136 is a poly silicon fuse having a very low resistance before programming. When the fuse 136 is programmed or blown, the fuse has an open fuse resistance.

When the control signal BLOW_ENABLE is low, Node A will be at a voltage no greater then 1.5V established by the resistive divider network of PFET 106, resistor 108 and NFET 110. NFET 110 is turned on. PFET 106 is partially turned on due to the gate to source voltage Vgs being approximately −1.8 V for PFET 106. PFET 104 is turned off with Vgs at 0V.

When control signal BLOW_ENABLE is high, NFET 110 is turned off and the gates of PFET 104 and PFET 106 are at 0V. The PFETs 104, 106 impress the voltage supply 3.3V on node FSOURCE. Supply switch 100 achieves 20 mA of blow current at 3.3V at node FSOURCE or the anode of the fuse 136. This is maintained for approximately 200 uS to achieve proper programming of the fuse 136. With the two-transistor stack of PFETs 104, 106 of supply switch 100, channel length modulation for PFETs 104, 106 is provided.

In the two transistor stack of PFETs 104, 106 of supply switch 100 the device sizes have a larger channel length to accommodate the drain to source voltage Vds. It has been shown that a Vds in a range between 1.5V and 1.8V is easily achievable across PFETs 104, 106. The extra channel length in the PFETs 104, 106 also helps to alleviate leakage and field stress concerns.

Figure 2:
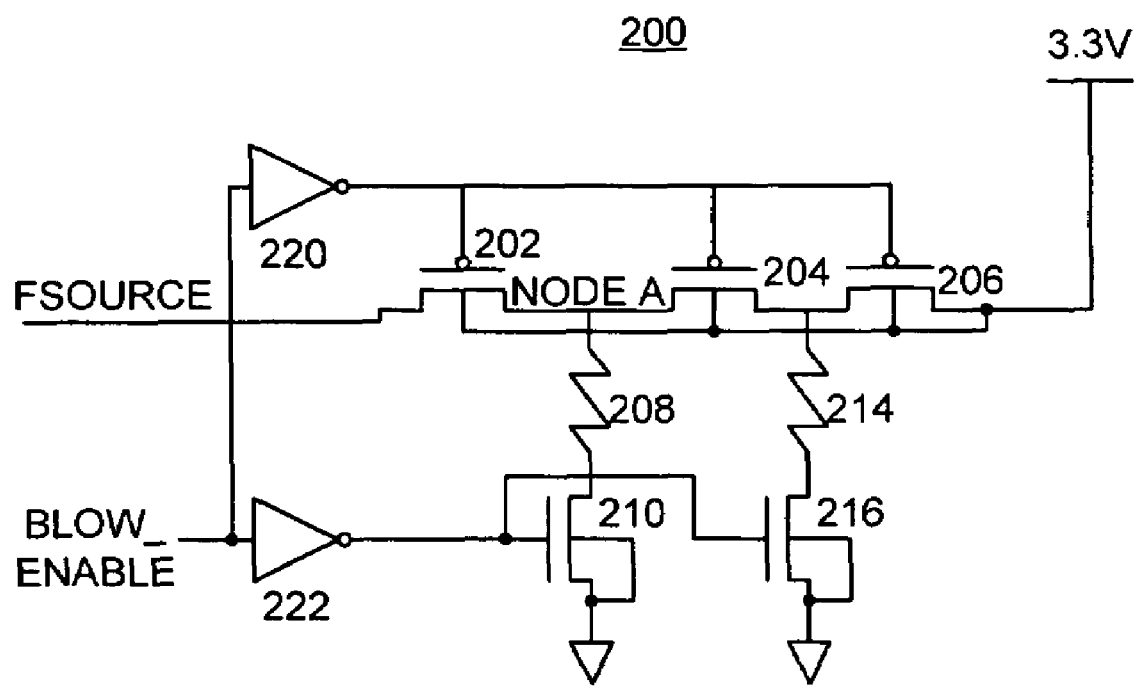
FIG. 2 is schematic diagram illustrating an alternative exemplary supply switch circuit for implementing a switchable on-chip high voltage supply in accordance with the preferred embodiment.

Additional stacking of devices advantageously can be provided to minimize voltage and field stress, as illustrated and described with respect to FIG. 2.

Referring to FIG. 2 there is shown another exemplary supply switch circuit for implementing a switchable on-chip high voltage supply in accordance with the preferred embodiment generally designated by the reference character 200. Supply switch circuit 200 includes an additive stage in the transistor stack to minimize field stress, as compared to supply switch circuit 100.

Supply switch circuit 200 includes a stack of transistors 202, 204, 206, coupled between the on-chip high voltage supply 3.3 V and the circuit node FSOURCE. Supply switch circuit 100 includes a first voltage divider defined by the PFET 204, a series connected resistor 208, and NFET 210 connected between a drain of the PFET 204 and ground. Supply switch circuit 100 includes a second voltage divider defined by the PFET 206, a series connected resistor 214, and NFET 216 connected between a drain of the PFET 206 and ground. The control signal BLOW_ENABLE is coupled to a respective gate of the PFETs 202, 204, 206 by an inverter 220. The control signal is coupled to a gate of the voltage divider NFETs 210, 216 by an inverter 222.

Supply switch circuit 200 similarly drops Vds voltages in the 1V range for all PFETs 202, 204, 206, when control signal BLOW_ENABLE is low and this is done without channel length modulation of PFETs 202, 204, 206. When control signal BLOW_ENABLE is low NFETs 210, 216 are turned on and PFETs 204, 206 are partially turned on and PFET 202 is turned off with the gate to source voltage Vgs at 0V.

When control signal BLOW_ENABLE is high, NFETS 210, 216 are turned off and the gates of PFET 202, PFET 204 and PFET 206 are at 0V. The PFETs 202, 204, 206 impress the voltage supply 3.3V on node FSOURCE. Supply switch 200 achieves, for example, 20 mA of blow current at 3.3V at node FSOURCE or the anode of the fuse 136. This similarly is maintained for approximately 200 uS to achieve proper programming of the fuse 136. With the three-transistor stack of PFETs 202, 204, 206 of supply switch 200, channel length modulation for PFETs 202, 204, 206 is not needed.

In both supply switching circuits 100, 200 field stress issues are eliminated or substantially mitigated. The plurality of PFETs forming the supply switching circuits 100, 200 can be implemented by various technologies, including silicon-on-insulator (SOI) complementary metal oxide semiconductor (CMOS) devices and bulk CMOS devices.

While the present invention has been described with reference to the details of the embodiments of the invention shown in the drawing, these details are not intended to limit the scope of the invention as claimed in the appended claims.

What is claimed is:

1. A supply switch circuit for implementing a switchable on-chip high voltage supply to a circuit node comprising:
   an on-chip high voltage supply;
   a stack of transistors coupled between said on-chip high voltage supply and said circuit node;
   a voltage divider included with said stack of transistors;
   a control signal coupled to the stack of transistors for selectively switching the high voltage supply to said circuit node;

said control signal coupled to said voltage divider to limit a maximum node voltage within said stack of transistors; and said circuit node is connected to a fuse and said control signal is a fuse blow enable signal.

2. A supply switch circuit as recited in claim 1 wherein said stack of transistors and said voltage divider include a plurality of field effect transistors (FETs).

3. A supply switch circuit as recited in claim 2 wherein said voltage divider is defined by a first P-channel field effect transistors (PFET) having a source connected to the high voltage supply of said stack of series connected PFETs, and a series connected resistor and an N-channel field effect transistor (NFET).

4. A supply switch circuit as recited in claim 3 wherein said series connected resistor and NFET is connected between a drain of said first PFET and a ground connection.

5. A supply switch circuit as recited in claim 4 wherein said control signal is coupled to a respective gate of said series connected PFETs in said stack and is coupled to a gate of the voltage divider NFET.

6. A supply switch circuit as recited in claim 5 wherein each of said series connected PFETs in said stack has a predefined channel length greater than a channel length of said voltage divider NFET.

7. A supply switch circuit as recited in claim 1 wherein said stack of transistors are field effect transistors and said voltage divider include a plurality of silicon-on-insulator (SOI) field effect transistors (FETs).

8. A supply switch circuit as recited in claim 1 wherein said stack of transistors includes a pair of P-channel field effect transistors (PFETs).

9. A supply switch circuit as recited in claim 8 wherein said control signal is coupled to a respective gate of said pair of PFETs.

10. A supply switch circuit as recited in claim 9 wherein each of said pair of series connected PFETs has a predefined channel length for a predetermined drain to source voltage.

11. A supply switch circuit as recited in claim 1 wherein said stack of transistors and said voltage divider include bulk complementary metal oxide semiconductor (CMOS) devices.

12. A supply switch circuit as recited in claim 1 wherein said stack of transistors and said voltage divider include silicon-on-insulator (S01) complementary metal oxide semiconductor (CMOS) devices.

13. A supply switch circuit as recited in claim 1 wherein said on-chip high voltage supply is about 3.3 volts.

14. A supply switch circuit for implementing a switchable on-chip high voltage supply to a circuit node comprising:
an on-chip high voltage supply;
a stack of transistors coupled between said on-chip high voltage supply and said circuit node; said stack of transistors including three series connected P-channel field effect transistors (PFETs), said three series connected PFETs including a first PFET having a source connected to said on chip high voltage supply; a second PFET having a source connected to a drain of said first PFET, and a third PFET having a source connected to a drain of said second PFET and a drain connected to said circuit node'
a voltage divider included with said stack of transistors;
a control signal coupled to the stack of transistors for selectively switching the high voltage supply to said circuit node; and
said control signal coupled to said voltage divider to limit a maximum node voltage within said stack of transistors.

15. A supply switch circuit as recited in claim 14 wherein said voltage divider is defined by said first PFET, and a series connected resistor and N-channel field effect transistor (NFET) connected between said drain of the first PFET and a ground connection.

16. A supply switch circuit as recited in claim 15 further includes a second voltage divider; said second voltage divider is defined by said second PFET, a second series connected resistor and N-channel field effect transistor (NFET) connected between said drain of the second PFET and said ground connection.

17. An on-chip supply switch circuit for implementing a switchable on-chip high voltage supply to a circuit node comprising:
an on-chip high voltage supply;
a stack of P-channel field effect transistors (PFETs) coupled between said on-chip high voltage supply and said circuit node;
a voltage divider included with said stack of PFETs; said voltage divider including a series connected resistor and N-channel field effect transistor (NFET) connected between a node within said stack of PFETs and a ground connection; a control signal coupled to a gate of said NFET;
said control signal coupled to a respective gate of said PFETs for selectively switching the high voltage supply to said circuit node; and
said control signal coupled to said voltage divider to limit a maximum node voltage within said stack of transistors.

18. An on-chip supply switch circuit as recited in claim 17 wherein said stack of PFETs and said voltage divider is defined by a selected one of silicon-on-insulator (SOI) complementary metal oxide semiconductor (CMOS) devices and bulk complementary metal oxide semiconductor (CMOS) devices.

* * * * *